(12) United States Patent
Stadelmeier et al.

(10) Patent No.: US 9,154,280 B2
(45) Date of Patent: Oct. 6, 2015

(54) COMMUNICATIONS SYSTEM USING ADAPTIVE ORTHOGONAL FREQUENCY DIVISION MULTIPLEXING

(75) Inventors: Lothar Stadelmeier, Stuttgart (DE); Andreas Schwager, Waiblingen (DE); Daniel Schneider, Stuttgart (DE)

(73) Assignee: SONY Corporation, Tokyo (JP)

( * ) Notice: Subject to any disclaimer, the term of this patent is extended or adjusted under 35 U.S.C. 154(b) by 53 days.

(21) Appl. No.: 13/582,234

(22) PCT Filed: Mar. 7, 2011

(86) PCT No.: PCT/EP2011/001109
§ 371 (c)(1),
(2), (4) Date: Oct. 26, 2012

(87) PCT Pub. No.: WO2011/110320
PCT Pub. Date: Sep. 15, 2011

(65) Prior Publication Data
US 2013/0039397 A1 Feb. 14, 2013

(30) Foreign Application Priority Data
Mar. 8, 2010 (EP) .................................... 10002374

(51) Int. Cl.
*H04L 5/12* (2006.01)
*H04L 5/00* (2006.01)
(Continued)

(52) U.S. Cl.
CPC ......... *H04L 5/0046* (2013.01); *H03M 13/2742* (2013.01); *H03M 13/2789* (2013.01); *H04L 1/0071* (2013.01); *H04L 5/0007* (2013.01); *H04L 27/2634* (2013.01)

(58) Field of Classification Search
None
See application file for complete search history.

(56) References Cited

U.S. PATENT DOCUMENTS

| 5,196,933 | A | 3/1993 | Henot |
| 6,944,120 | B2 | 9/2005 | Wu et al. |

(Continued)

FOREIGN PATENT DOCUMENTS

| CN | 100463541 C | 2/2009 |
| EP | 2 086 140 | 8/2009 |

(Continued)

OTHER PUBLICATIONS

International Search Report issued on Aug. 19, 2011 in PCT/EP11/001109 filed on Mar. 7, 2011.

(Continued)

*Primary Examiner* — Adolf Dsouza
(74) *Attorney, Agent, or Firm* — Oblon, McClelland, Maier & Neustadt, L.L.P.

(57) ABSTRACT

In a communications device a grouping unit uses channel state information when mapping data bits to a plurality of different constellation groups. Each constellation group is assigned to another modulation scheme. A plurality of sub-carriers is assigned to none or one of the constellation groups and each modulation uses another one of the constellation groups. The communications device includes at least one scalable interleaver unit, wherein each interleaver unit is assigned to one of the constellation groups and interleaves the assignment of data bits mapped to each constellation group and the sub-carriers that carry a symbol information derived from the data bits. As an example, the interleaver unit performs frequency interleaving by interleaving, at constellation level, the sub-carriers that carry the symbol information.

19 Claims, 10 Drawing Sheets

(51) Int. Cl.
  *H03M 13/27* (2006.01)
  *H04L 1/00* (2006.01)
  *H04L 27/26* (2006.01)

(56) References Cited

U.S. PATENT DOCUMENTS

2005/0034053 A1* 2/2005 Jacobsen et al. .............. 714/800
2009/0060068 A1* 3/2009 Goswami et al. ............. 375/260
2010/0098187 A1* 4/2010 Hottinen ....................... 375/267
2013/0294542 A1* 11/2013 Zhang et al. .................. 375/295

FOREIGN PATENT DOCUMENTS

| TW | M318290 | 1/1996 |
| TW | 200908599 A | 2/2009 |
| TW | 200952412 A1 | 12/2009 |
| WO | 2009 062630 | 5/2009 |

OTHER PUBLICATIONS

Office Action and Search Report issued Feb. 26, 2015 in Taiwanese Patent Application No. 100104111 (with English Translaton).

* cited by examiner

COMMUNICATIONS SYSTEM USING ADAPTIVE ORTHOGONAL FREQUENCY DIVISION MULTIPLEXING

Embodiments of the present invention relate to communications devices supporting adaptive OFDM (Orthogonal Frequency Division Multiplexing) using a plurality of different modulation schemes for sub-carriers. Further embodiments relate to a method of operating a communications system supporting adaptive OFDM and using a plurality of different modulation schemes for sub-carriers.

OFDM distributes data over a large number of orthogonal sub-carriers. The orthogonality of the sub-carriers allows a per-carrier demodulation at the receiver side, since at the receiver side the demodulators are prevented from considering other sub-carriers than that one they are dedicated to. OFDM provides high spectral efficiency and allows sub-carrier selection and modulation to be adapted to the transmission channel characteristics.

It is an object of the invention to provide communications devices with enhanced transmission performance and an operating method, which provides enhanced transmission performance in a communications system.

The object is achieved by the subject-matters of the independent claims. Further embodiments are specified in the dependent claims respectively. Details of the invention will become more apparent from the following description of embodiments in connection with the accompanying drawings, wherein features of the various embodiments may be combined unless they exclude each other.

Figure 1:
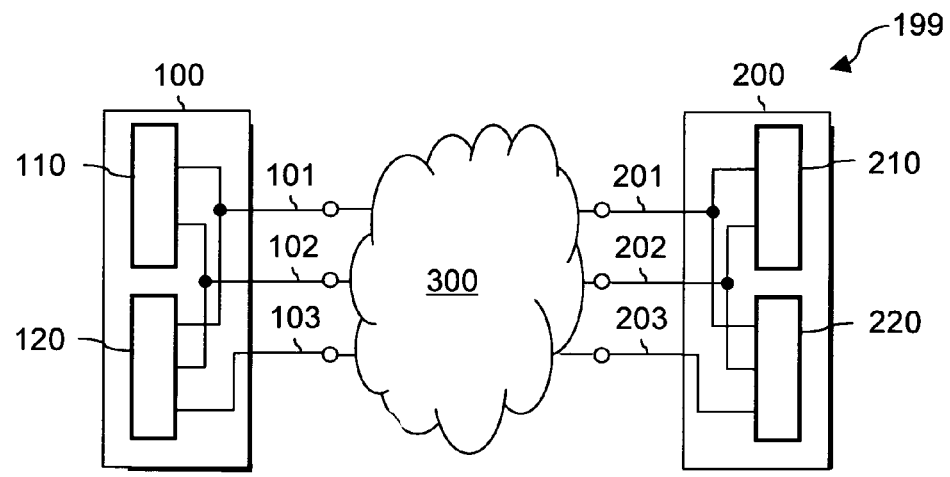
FIG. 1 is a schematic block diagram illustrating a communications system with a first communications device including a transmitter unit and a second communications device including a receive unit in accordance with an embodiment of the invention.

FIG. 1A shows a wired or wireless communications system 199, which is based on an OFDM modulation scheme, for example a DVB-C2 (digital video broadcasting-cable) system. In accordance with an embodiment, the communications system 199 is a system using power distribution wires for data communication. For example, the communications system 199 is a power line communications (PLC), mains communications, power line telecommunications (PLT), broadband power line (BPL) or power band or power line networking (PLN) system using a modulated carrier superimposed to the power line alternating current, which may have a frequency of 50 or 60 Hz, by way of example.

The communications system 199 may be a SISO (single-input-single-output) or a MIMO (multiple-input-multiple-output) system with a first communications device 100, which includes a transmitter unit 110 employing one, two or more transmit ports 101-103, and a second communications device 200, which includes a receive unit 220 employing at least one, for example two, three or four, receive ports 201-203. A transmission channel 300 connects the transmitter unit 110 and the receive unit 220.

The first communications device 100 may be an exclusively transmitting device with transmit ports 101-103 only. According to other embodiments, the first communication device 100 is a bidirectional device including, in addition to the transmitter unit 110, a receive unit 120 which may be of the type of a receive unit 220 in the second communications device 200, wherein the ports 101-103 may be bidirectional ports. The second communications device 200 may be an exclusively receiving device. According to other embodiments, the second communications device 200 is a bidirectional device including, in addition to the receive unit 220, a transmitter unit 210 which may be of the type of the transmitter unit 110 in the first communications device 100, wherein the ports 201-203 may be bidirectional ports. The communications devices 100, 200 may be stand-alone devices or may be integrated in an electronic device for consumer applications, for example a storage unit, a television set, an audio receiver, or a video recorder.

The transmission channel 300 may be multi-wire connection. In accordance with an embodiment, the transmission channel 300 is a power cable containing two or more electrical conductors used for transmission of AC (alternating current) electric power and installed as permanent wiring within buildings or buried in the ground. For example, the transmitter unit 110 may supply two differential transmit signals using the live or phase wire (L, P), the neutral wire (N), and protective earth (PE), wherein the differential transmit signals are modulated on a carrier superposing the AC frequency of the mains voltage. According to an embodiment, the receive unit 220 receives three differential receive signals between live wire and neutral wire, between neutral wire and protective earth, and between live wire and protective earth. According to another embodiment, the receive unit 220 may receive the three differential receive signals and a common mode signal resulting from a leakage current from the wiring as a fourth receive signal.

Figure 2:
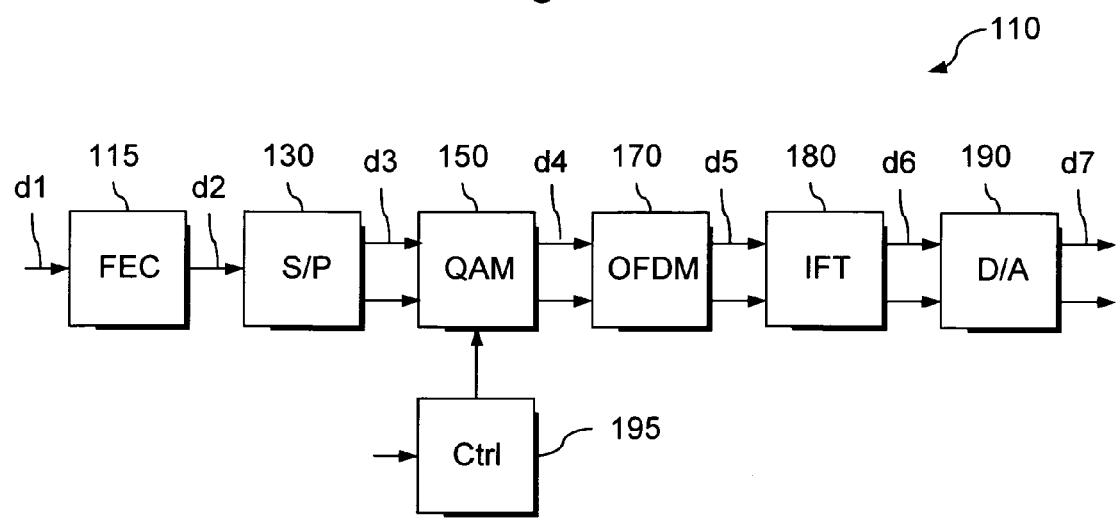
FIG. 2 is a schematic block diagram illustrating the transmitter unit of FIG. 1 in more detail.

FIG. 2 shows the transmitter unit 110 of FIG. 1 in more detail. The transmitter unit 110 receives an input data stream d1 including payload data to be transmitted over the transmission channel. An FEC (forward error correction) unit 115 inserts code redundancy into the input data stream d1 according to an error detection scheme for facilitating error correction at the receiver side. The FEC unit 115 outputs an encoded data stream d2.

The transmitter unit 110 may include a serial-to-parallel multiplexer unit 130 that receives the encoded data stream d2 and splits or multiplies the encoded data stream d2 into a predefined number of parallel data streams d3, wherein each data stream d3 is assigned to one of a plurality of signal paths, wherein each signal path corresponds to one of the transmit ports. In embodiments referring to SISO systems, the multiplexer unit 130 is omitted and the encoded data stream d2 is directly transmitted to a first modulator unit 150.

According to the illustrated embodiment, the parallel data streams d3 are transmitted to a first modulator unit 150. The first modulator unit 150 includes, for each signal path, a plurality of modulations. Each modulation is assigned to a constellation group, wherein each constellation group uses another modulation scheme. The modulation scheme may be any modulation from 1 bit up to x bits per carrier, for example PSK (Phase-Shift Keying), QPSK (Quadrature Phase-Shift Keying), 4-QAM (Quadrature Amplitude Modulation), 8-QAM, 64-QAM, 256-QAM, 1024-QAM, 4096-QAM, any other $2^n$-QAM, or any $2^n$-PAM (Pulse Amplitude Modulation). In dependence on the SNRs determined for each sub-carrier, for each signal path a control unit 195 assigns the sub-carriers to one of the constellation groups. Each modulation in each signal path combines data bits to symbols for addressing the constellation points of the respective constellation group and outputs modulated sub-carriers carrying the symbol information d4.

According to embodiments of the invention, each constellation group of the first modulator unit 150, or each modulation is combined with an interleaving process suitable for performing interleaving at bit level, at symbol level or at constellation level in each modulation path, wherein each interleaving process has a variable size and can be adapted to the number of sub-carriers available for the respective constellation group. For instance, symbols of a constellation group might be mapped to various frequency carriers.

A second modulator unit 170 may modulate the sub-carriers carrying the symbol information d4 of the various modulations of each signal path on a main carrier to generate one digital transmission stream d5 for each signal path. These operations may be performed in the frequency domain and an IFT (inverse Fourier transformation) unit 180 may transform the digital transmission streams d5 into the time domain to obtain a digital signal d6 for each signal path. A converter unit 190 may convert the digital signal d6 into analogue transmission signals d7 and couples each analogue transmit signal d7 to one of the transmit ports.

Figure 3A:
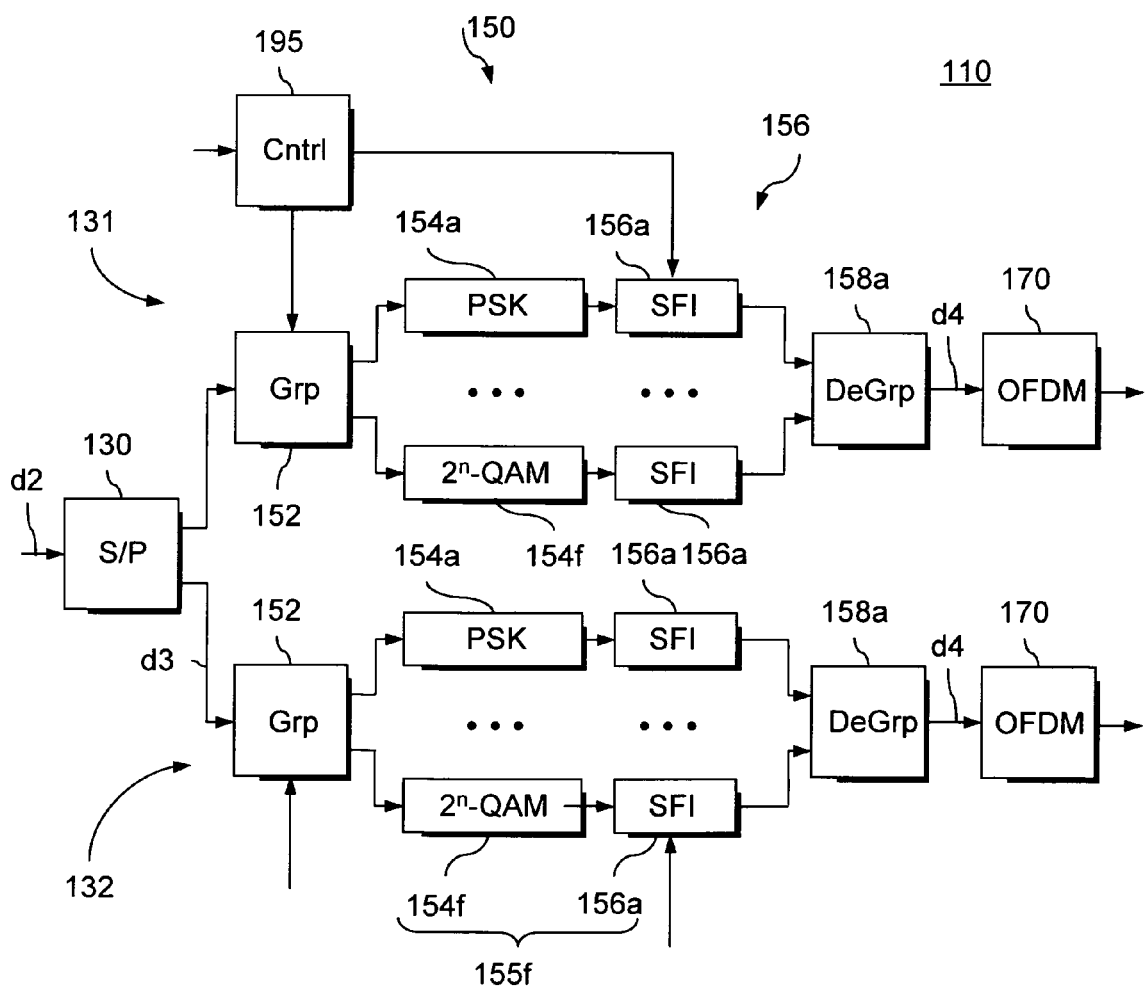
FIG. 3A is a schematic block diagram illustrating a communications device providing intra-output frequency interleaving at a constellation level in accordance with an embodiment.

FIG. 3A refers to a transmitter unit 110 with two signal paths 131, 132 and shows details of an embodiment of the first modulator unit 150 of FIG. 2. In each signal path 131, 132 a grouping unit 152 may map the data bits, which are contained in the data stream d3 assigned to the signal path 131, 132, to a plurality of modulation paths, wherein each modulation path is assigned to a constellation group. Each single of a plurality of sub-carriers is assigned to none or one of the different constellation groups. According to an embodiment, the assignment of the sub-carriers to the constellation groups may be performed according to channel state information describing frequency dependent channel characteristics such that the modulation scheme applied to a sub-carrier depends on the current transmission channel characteristic for this sub-carrier on the respective transmission path. The transmission channel characteristics may change with time and the assignment of the sub-carriers to the constellation groups may be continuously adapted.

A constellation control unit 195 may receive or derive the channel state information from feedback information that the transmit unit 110 may receive from another communications device with which the transmit unit 110 communicates. In the case the transmit unit 110 is included in a communications device 100 which also includes a receive unit 120 as shown in FIG. 1, the receive unit may be used for receiving the feedback information.

For each modulation path the modulator unit 150 includes a modulation unit 154a-f realizing the respective constellation group and using a configurable number of sub-carriers to generate a modulated output signal, which may be, for example, a PSK, a QPSK, a 16-QAM, 64-QAM, 256-QAM, 1024-QAM, a 4096-QAM any other $2^n$-QAM, or a 2-PAM or any other $2^n$-PAM signal. Each modulation unit 154a-f uses another one of the constellation groups. The outputs of the modulation units 154a-f represent modulated sub-carriers. The bits contained in the data stream delivered by the grouping unit 152 are mapped to QAM symbols. Dependent on the transmission channel characteristics, each modulation unit 154a-f processes a different number of symbols. Each modulation unit 154a-f is adaptive and programmable with regard to the number and frequency of the used sub-carriers. For example, the constellation control unit 195 may be capable of determining the number and the frequencies of the sub-carriers used in each modulation unit 154a-f according to the current transmission channel characteristics.

In accordance with an embodiment, for each modulator path the interleaving unit 156 includes an interleaver unit 156a that interleaves the sub-carriers in the respective modulator path on constellation level. The interleaver units 156a may be based on pseudo-random number generators, for example shift registers, where the register input is derived from an exclusive- or function of two register cell outputs. The interleaver units 156a are sealable such that each interleaver unit 156a is capable of handling different numbers of sub-carriers in the same constellation group. In this way, the interleaver unit 156a can be combined with adaptive modulation units 154a-f and each interleaver unit 156a can be controlled according to the mode of that modulation unit 154a-f it is assigned to.

In each signal path 131, 132, a degrouping unit 158a may recombine the frequency interleaved sub-carrier groups of the QAM modulator paths, where the interleaved sub-carrier groups are reordered at their original positions, but where the sub-carriers in each of the QAM constellation groups are spread due to the interleaving process. As a result, frequency diversity is increased significantly. Increased frequency diversity improves system bit error performance, especially in case of narrowband interferers. The scalability of the interleaver units 156a allows the combination with an adaptive OFDM system.

In accordance with another embodiment, the modulator unit 150 may include one single modulation unit, which can be over sampled to process the group of carriers serially instead of parallelly as in the preceding embodiment. The symbols of each constellation group can be mapped to various frequency carriers. In a MIMO system, the various carriers of a constellation group can be split to different communication paths.

Figure 3B:
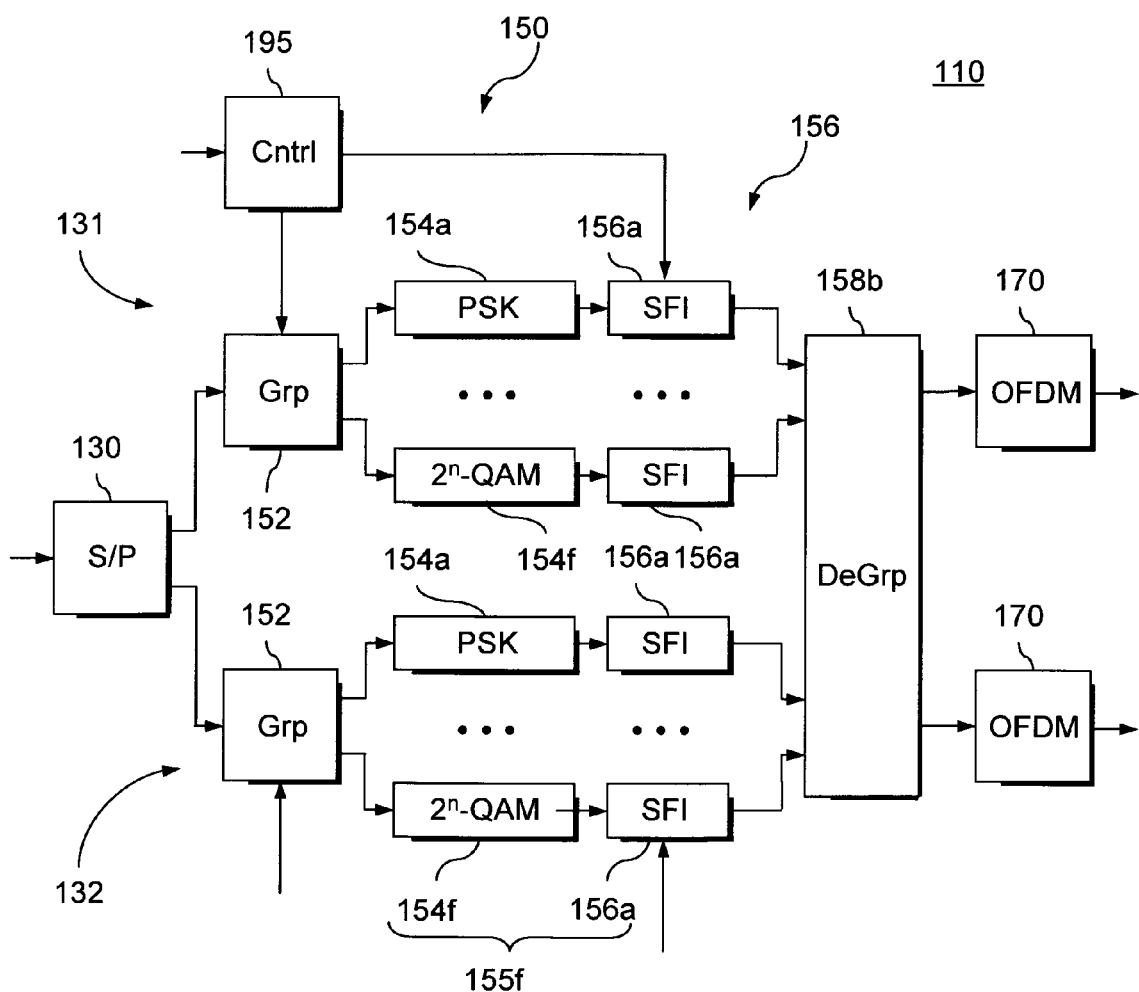
FIG. 3B is a schematic block diagram illustrating a communications device providing inter-output frequency interleaving at a constellation level in accordance with another embodiment.

The transmitter unit 110 of FIG. 3B exclusively refers to MIMO systems and differs from that illustrated in FIG. 3A in that one single degrouping unit 158*b* combines the frequency interleaved groups of at least two signal paths 131, 132. According to an embodiment, one single combined degrouping unit 158*b* combines the frequency interleaved groups of all, for example three or four, signal paths 131, 132 of the transmitter unit 110. This allows a further degree of diversity since information which otherwise would be encoded in one transmission path can be transmitted via more than one transmission path such that transmission becomes more robust against interferences on one transmission path.

Figure 3C:
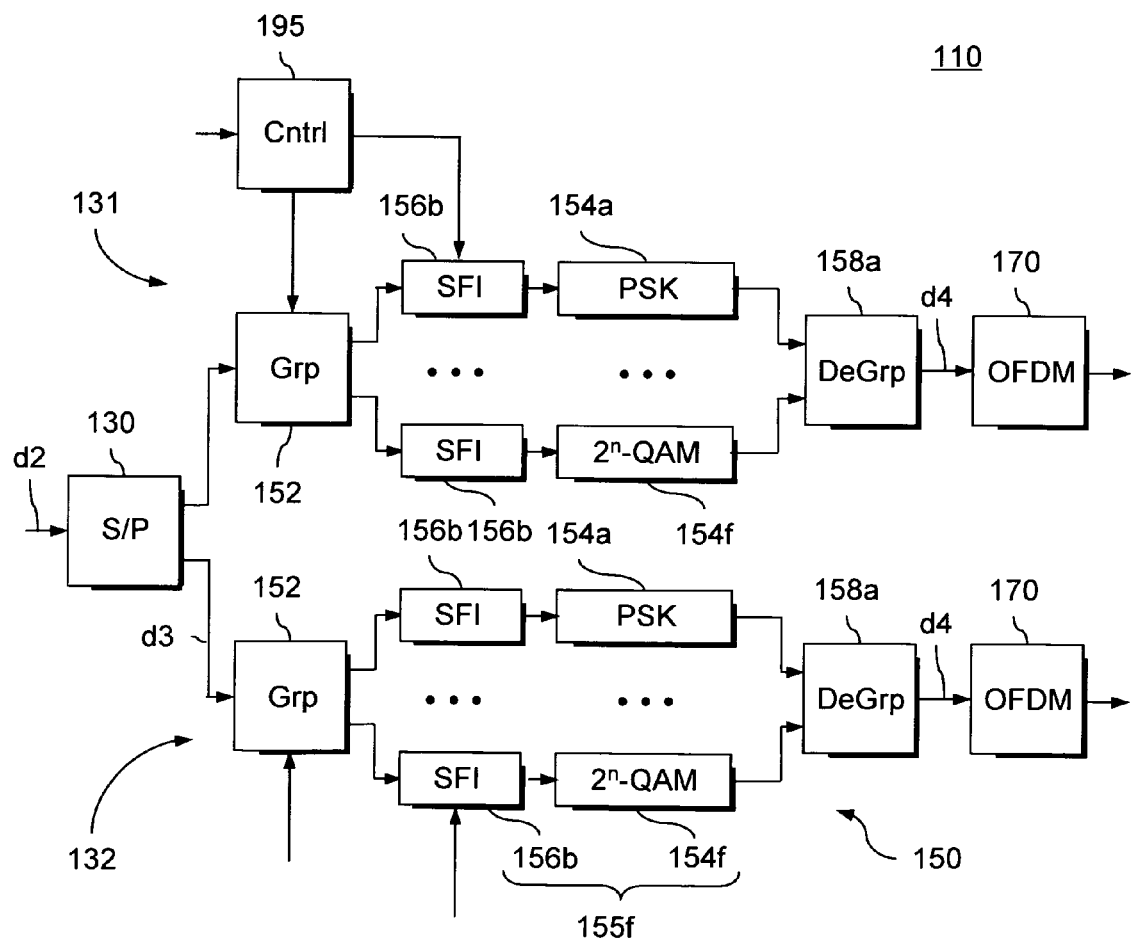
FIG. 3C is a schematic block diagram illustrating a communications device providing intra-output frequency interleaving at a bit or symbol level in accordance with another embodiment.

FIG. 3C refers to another embodiment of a transmitter unit 110 with at least two signal paths 131, 132. In each signal path 131, 132 a grouping unit 152 maps data bits contained in the respective data stream d3 to one of a plurality of modulation paths, wherein each modulation path is assigned to another, different constellation group.

Each single of a plurality of sub-carriers is assigned to none or one of the constellation groups. According to an embodiment, the assignment of sub-carriers to constellation groups is performed in accordance with tonemap information describing frequency dependent characteristics of the current transmission channel. A constellation control unit 195 may receive and manage the tonemap information.

In each modulator path an interleaver unit 156*b* may interleave the data bits in the respective modulator path before the data bits are grouped to symbols, or may interleave the symbols before or when they are used to address the various constellation points of the respective constellation group.

In each signal path 131, 132 a modulation units 154*a-f* is provided for each constellation group. Each modulation unit 154*a-f* uses a configurable number of sub-carriers and the interleaved data bits or symbols to generate modulated sub-carriers carrying the symbol information, and may be capable of using a PSK, QPSK, a 16-QAM, 64-QAM, 256-QAM, 1024-QAM, a 4096-QAM, any other $2^n$-QAM or any $2^n$-PAM scheme, by way of example. Each modulation unit 154*a-f* uses another one of the constellation groups. Each modulation unit 154*a-f* is adaptive and programmable with regard to the number and frequencies of the used sub-carriers. For example, the constellation control unit 195 may be capable of determining the number and the frequencies of the sub-carriers used in each modulation unit 154*a-f* according to the current transmission channel characteristics.

The interleaver units 156*b* are scalable such that each interleaver unit 156*b* is capable of handling different number of sub-carriers. Therefore the interleaver units 156*b* can be combined with the adaptive modulation units 154-*f*, wherein each interleaver unit 156*b* is controlled in accordance with the mode of the respectively assigned modulation unit 154*a-f*.

In each signal path 131, 132, a degrouping unit 158*a* may recombine the interleaved sub-carrier groups of the modulator paths of each signal path 131, 132, wherein the interleaved sub-carrier groups are reordered into their original positions, but wherein the sub-carriers of the different constellation groups are spread due to the frequency interleaving.

Figure 3D:
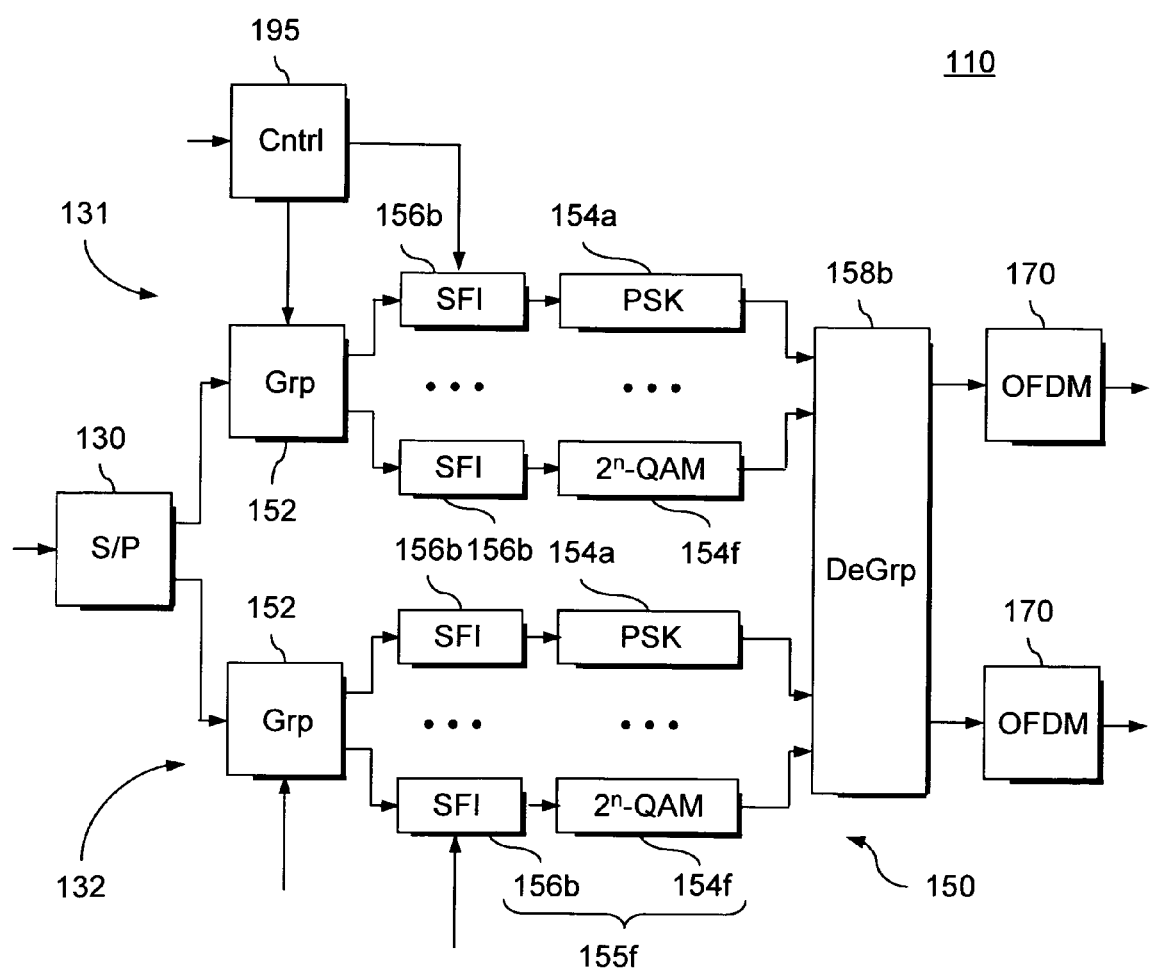
FIG. 3D is a schematic block diagram illustrating a communications device providing inter-output frequency interleaving at a bit or symbol level in accordance with another embodiment.

The transmitter unit 110 of FIG. 3D exclusively refers to MIMO systems and differs from that illustrated in FIG. 3C in a single combined degrouping unit 158*b* that combines the frequency interleaved groups of at least two signal paths 131, 132. According to an embodiment, the combined degrouping unit 158*b* combines the frequency interleaved groups of three, four or all signal paths of the transmitter unit 110.

Each sub-unit of the transmit unit 110 may be realized in hardware, software or as a combination thereof. In accordance with embodiments, at least some of the sub-units of the transmit unit 110 are realized as digital signal processing circuits integrated in an integrated circuit. According to other embodiments the transmit unit is a software module of a simulation program.

The diagrams of FIGS. 4A to 4D illustrate the signal processing method accomplished by the transmission unit 110 of FIG. 3A by means of an illustrating example. The channel characteristics of the current transmission channel are evaluated to generate channel state information describing, for example, the signal-to-noise ratio for each sub-carrier frequency used for transmission.

Figure 4A:
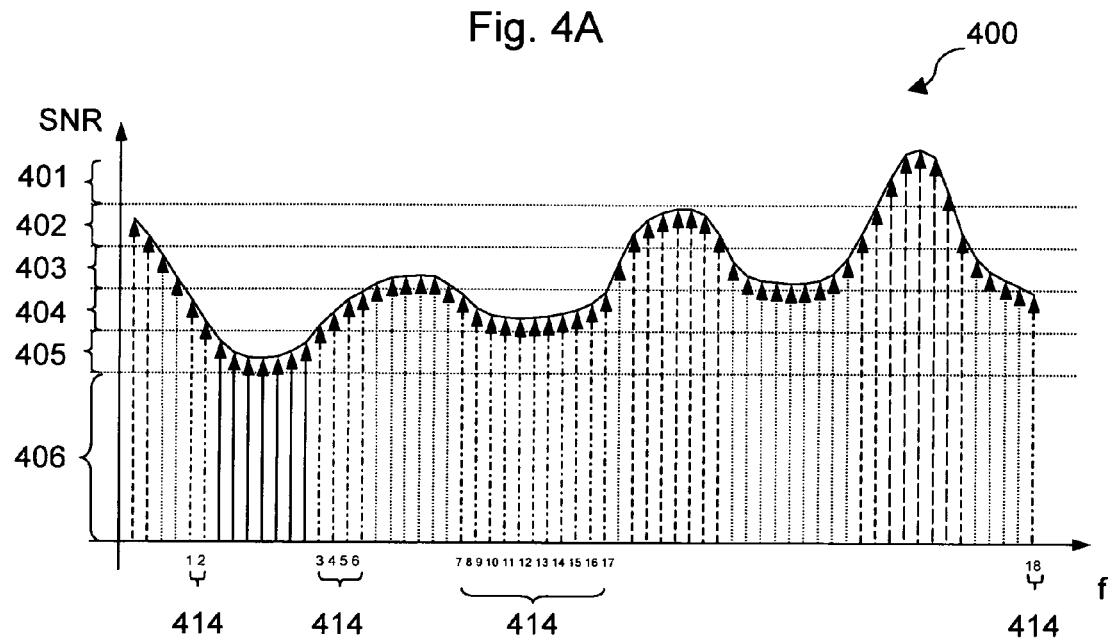
FIG. 4A is a schematic diagram for illustrating the grouping of sub-carriers to constellation paths in dependence on an SNR (signal-to-noise ratio) determined for the respective sub-carrier and illustrates the mode of operation of a communications system in accordance with another embodiment.

FIG. 4A shows an illustrative tonemap 400 as a diagram where the SNR is plotted against the discrete frequencies of the sub-carriers. Based on the tonemap information a constellation control unit may assign each sub-carrier to none or one of a plurality of modulation paths, wherein each modulation path corresponds to another constellation group. For example, the total SNR range is divided into a plurality of consecutive ranges 401-406. Sub-carriers with an SNR falling in the same range are assigned to the same modulation path. Sub-carriers falling in a range of high SNR may be assigned to a modulation path using a modulation scheme with a small distance between the constellation points, for example 4096-QAM. Sub-carriers falling in a range of low SNR may be assigned to a modulation path using a modulation scheme with a high distance between the constellation points, for example QPSK, and sub-carriers with an SNR falling below a predefined threshold may be excluded from being used. The tonemaps of the transmission paths of a transmission channel may differ from each other.

In accordance with the illustrative example, sub-carriers whose SNR fall in a first range 401 are assigned to a 4096-QAM modulation path, sub-carriers whose SNR fall in a second range 402 are assigned to a 1024-QAM modulation path, sub-carriers whose SNR fall in a third range 403 are assigned to a 256-QAM modulation path, sub-carriers whose SNR fall in a fourth range 404 are assigned to a 64-QAM modulation path, sub-carriers whose SNR fall in a fifth range 405 are assigned to a 16-QAM modulation path, and sub-carriers whose SNR fall in a sixth range 406 may be assigned to a QPSK modulation path or may be omitted for transmission.

Figure 4B:
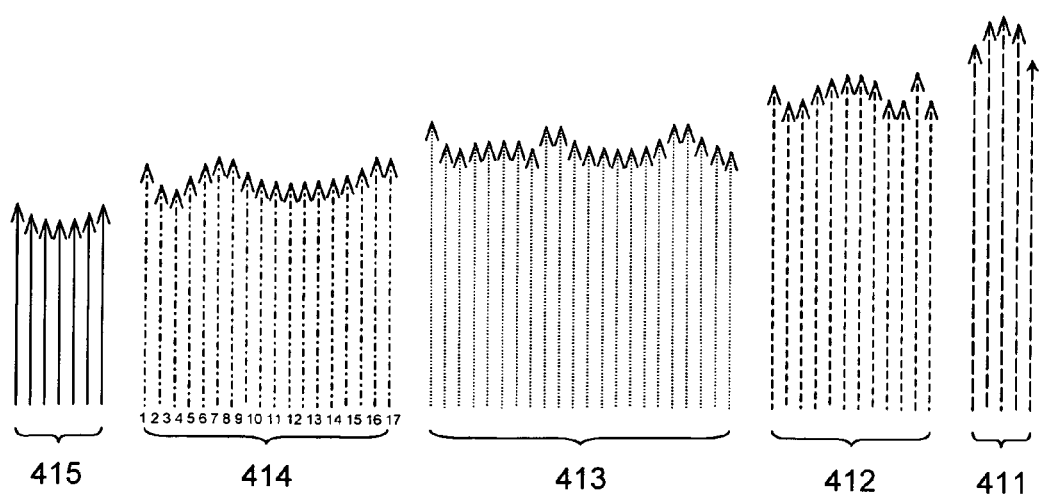
FIG. 4B is a schematic diagram illustrating the sub-carriers of FIG. 4B being grouped to different constellation paths in dependence on the SNR.

FIG. 4B shows the sub-carrier groups used in the respective modulation path. For example, a first sub-carrier group 411 is used in the 4096-QAM modulation path, a second sub-carrier group 412 is used in the 1024-QAM modulation path, a third sub-carrier group 413 is used in the 256-QAM modulation path, and a fourth sub-carrier group 414 is used in the 16-QAM modulation path. In FIG. 4B the height of an arrow assigned to a sub-carrier corresponds to that in FIG. 4A for the only purpose of identifying the sub-carrier and visualizing the effects of grouping and interleaving and does not relate to an amplitude of the sub-carrier.

Figure 4C:
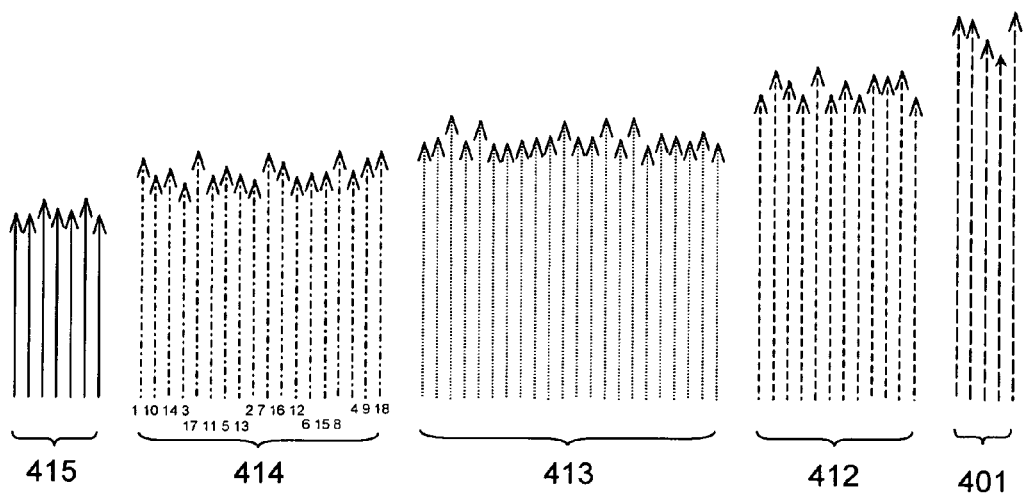
FIG. 4C is a schematic diagram illustrating the grouped sub-carriers of FIG. 4B frequency-interleaved at constellation level.

FIG. 4C shows the effect of the interleaver units 156*a* of FIG. 3A. Each interleaver unit 156*a* interleaves the sub-carriers such that their sequence within the group is changed. As a result, successive data bits or symbols use spaced sub-carriers, whereas without interleaving, sub-carriers carrying symbol information referring to successive data bits or symbols would often use directly adjoining sub-carriers.

Figure 4D:
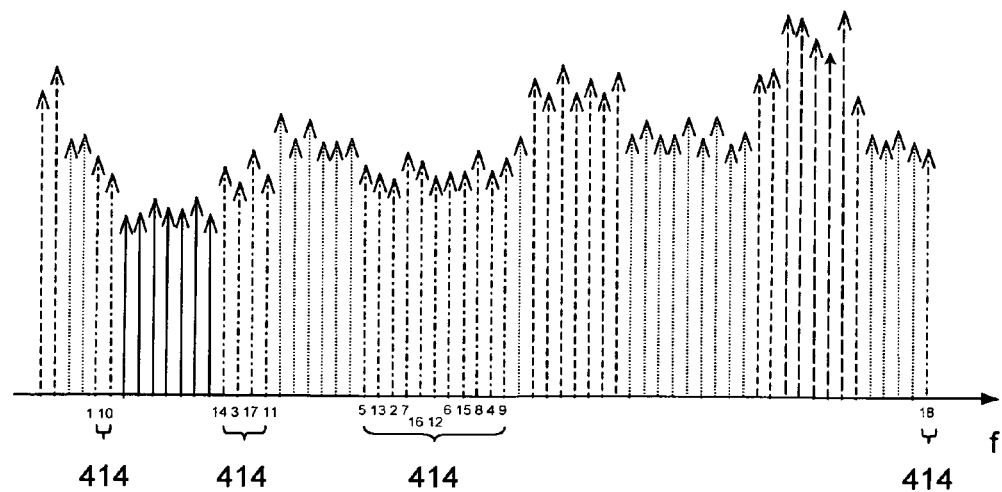
FIG. 4D is a schematic diagram illustrating the sub-carriers of FIG. 4C in an order in which they are provided to an IFFT (inverse fast Fourier transformation) unit recombining the modulated sub-carriers of FIG. 4C to generate a signal in the time domain.

FIG. 4D shows the effect of the degrouping unit 158a of FIG. 3A. The degrouping unit 158a combines the sub-carriers of all modulation paths, wherein it uses the inverse of the grouping scheme used by the grouping unit 152 and reverses the grouping performed by the grouping unit 152. As illustrated in FIG. 4D, with respect to FIG. 4A, each sub-carrier has changed its position within its sub-carrier group.

The modulation units 154a-f may use orthogonal constellations. According to other embodiments, each of the modulation units 154a-f may use a rotated constellation. Rotated constellations allow two different PAM (phase amplitude modulation) decoders instead of a single QAM modulator.

Figure 5:
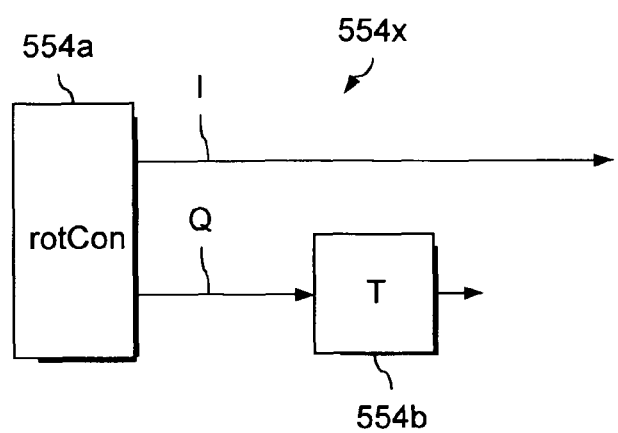
FIG. 5 is a schematic block diagram illustrating a modulation unit for rotated constellations according to another embodiment.

FIG. 5 shows a modulation unit 554g for rotated constellation. A rotation constellation unit 554a generates the orthogonal I and Q components of a rotated constellation. A delay unit 554b delays one of the components, for example the Q component, by one cell/symbol. Each modulation unit of a modulator unit may delay the same component by the same amount. According to an embodiment, subsequent interleaver units then ensure that these related components travel in separated sub-carriers. In accordance to an embodiment, constellation rotation and a delay of the Q component is performed in all constellation groups of a signal path separately. Otherwise, with mixed QAM constellations, the output of the QAM constellation stage would include I and Q components from different constellation sizes that do not match with the SNR characteristics of the final chosen sub-carrier.

Use of rotated constellations in connection with frequency interleaving allows significant performance improvement for multipath and so-called eraser channels.

Figure 6A:
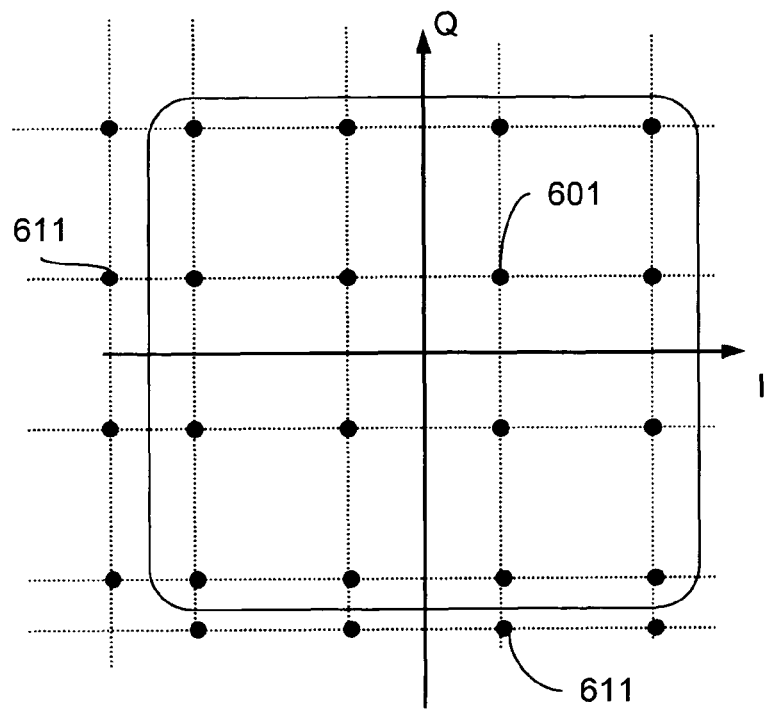
FIG. 6A is a schematic diagram illustrating an orthogonal constellation map for illustrating effects of embodiments of the invention.

FIG. 6A shows an orthogonal constellation map for 16-QAM. In each case, four constellation points 601 are projected to the same projection points 611 on the I and Q axes.

Figure 6B:
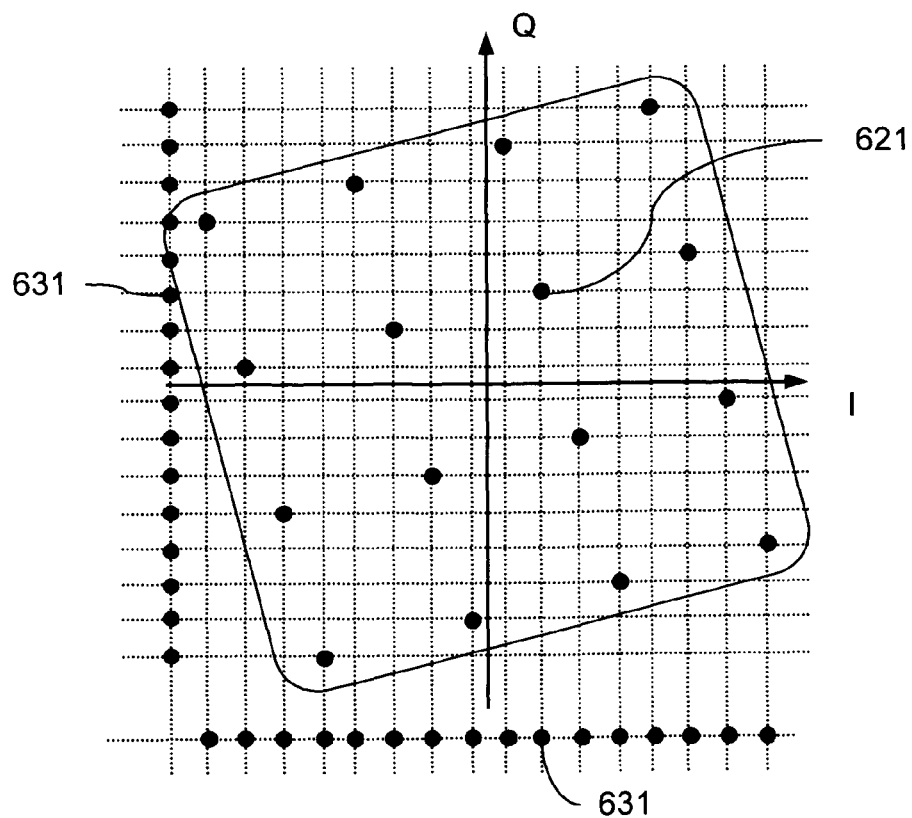
FIG. 6B is a schematic diagram illustrating a rotated constellation map for illustrating effects of embodiments of the invention.

In contrast, with the rotated constellation of FIG. 6B, each constellation point 621 is projected onto another projection point 631 with reference to both axes I and Q, such that it is possible, for example, to omit the evaluation of one of the axes, i.e. one of the carriers at the receiver side.

Figure 7:
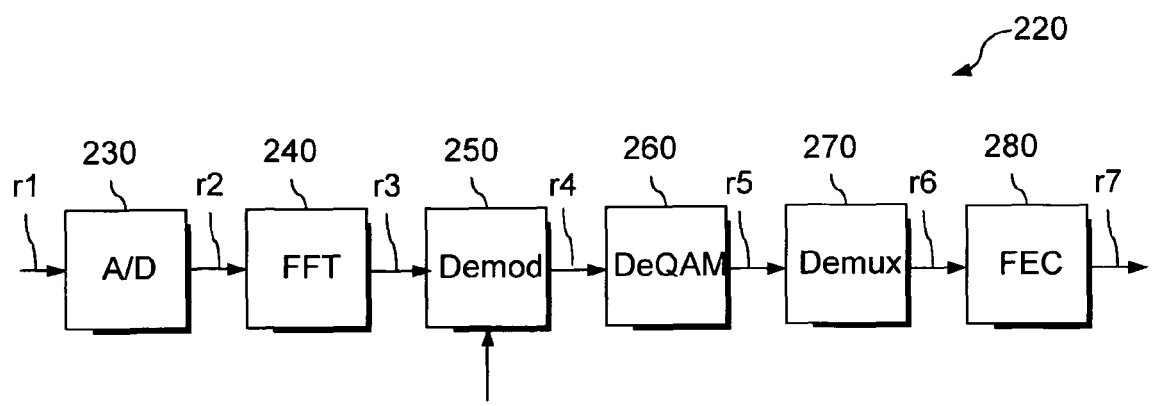
FIG. 7 is a schematic block diagram of a receive unit according to a further embodiment.

FIG. 7 refers to details of the receive unit 220 of the communications device 200 of FIG. 1. A converter unit 230 samples one or more, for example two, three, or four analogue receive signals r1 to generate digital receive signals r2. A Fourier transformation unit 240 may transform the digital receive signals r2 into the frequency domain, wherein for each digital receive signal a digital data stream r3 may be generated. A first demodulator unit 250 may decompose, in the frequency domain, each data stream into two orthogonally modulated components.

A second demodulator unit 260 includes a plurality of QAM demodulators using different constellation groups for each digital data stream r3. The second demodulator unit 260 includes for each digital data stream r3 and for each constellation group a scalable de-interleaver unit capable of de-interleaving the data streams r3 in accordance with an interleaving mechanism used on the transmission side. A demultiplexer unit 270 may recombine the two or more demodulated signals r5 to a combined receive signal r6 and a forward error correction unit 280 may use code redundancy included in the signal on the receiver side for detecting and correcting data errors in a receive signal r7.

According to an embodiment, each de-interleaver unit reverses an interleaving process performed on the transmitter side on constellation level. In accordance with other embodiments, each de-interleaver unit reverses an interleaving process performed on the transmitter side on bit or symbol level. According to further embodiments the receive unit 220 comprises a further mapping unit for reversing an inter-output diversity in the transmission signal as discussed above with regard to the combined degrouping units 158a in FIGS. 3B and 3D.

Each sub-unit of the receive unit 220 may be realized in hardware, software or as a combination thereof. In accordance with embodiments, at least some of the sub-units of the receive unit 220 are realized as digital signal processing circuits integrated in an integrated circuit.

Figure 8:
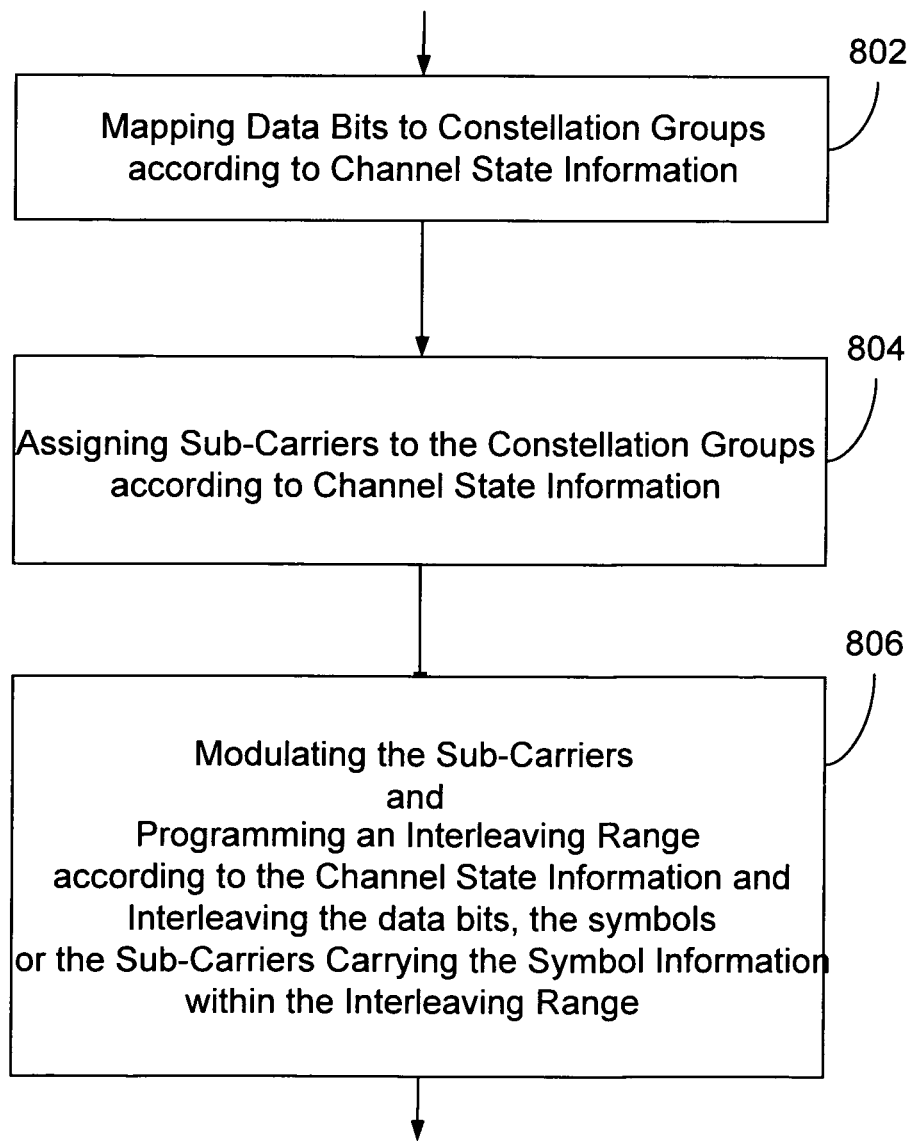
FIG. 8 is a simplified flow chart illustrating a method for operating a communications system in accordance with further embodiments.

FIG. 8 refers to a method of operating a communications device. Data bits are mapped to a plurality of constellation groups according to channel state information (802). Each sub-carrier of a plurality of sub-carriers is assigned to none or one of the constellation groups according to the channel state information (804). Symbols derived from groups of data bits are mapped to the respective constellation group and modulated onto the sub-carriers assigned to the respective constellation group. The assignment of data bits mapped to each constellation group to the sub-carriers that carry the symbol information is interleaved, wherein a range of interleaving, for example the number of concerned sub-carriers, is selected according to the channel state information (806).

In accordance with an embodiment, the modulated sub-carriers carrying the symbol information are interleaved at constellation level. According to another embodiment the data bits mapped to the respective constellation group are interleaved at bit level before the data bits are grouped to symbols used for addressing constellation points of the respective constellation group. According to further embodiments, symbols formed by groups of data bits are interleaved before or when the symbols are mapped to the sub-carriers assigned to the respective constellation group.

The invention claimed is:

1. A communications device comprising:
   transmitting circuitry that includes:
   grouping circuitry configured to map data bits to a plurality of constellation groups according to channel state information;
   modulator circuitry configured to modulate the data bits using a plurality of modulation schemes, a first group of a plurality of sub-carriers being assigned to a first constellation group of the plurality of constellation groups and a second group of the plurality of subcarriers being assigned to a second constellation group of the plurality of constellation groups, and each constellation group of the plurality of constellation groups using a different modulation scheme of the plurality of modulation schemes; and
   scalable interleaving circuitry configured to interleave the first group of the plurality of subcarriers that are assigned to be modulated by a first modulation scheme of the plurality of modulation schemes, and to interleave the second group of the plurality of subcarriers that are assigned to be modulated by a second modulation scheme of the plurality of modulation schemes.

2. The communications device of claim 1, wherein
   the modulator circuitry includes a plurality of modulation circuitry portions, each modulation circuitry portion using a different one of the plurality of modulation schemes; and
   the scalable interleaving circuitry includes a plurality of scalable interleaver circuitry portions, wherein each scalable interleaver circuitry portion is assigned to one of the plurality of constellation groups and is configured to interleave respective sub-carriers carrying respective symbol information derived from respective data bits.

3. The communications device of claim 2, wherein
said each scalable interleaver circuitry portion is configured to interleave the respective sub-carriers carrying the respective symbol information.

4. The communications device of claim 2, wherein
said each scalable interleaver circuitry portion is configured to interleave single data bits mapped to a respective constellation group before mapping the data bits to symbols used for addressing constellation points of the respective constellation group.

5. The communications device of claim 2, wherein
said each scalable interleaver circuitry portion is configured to interleave symbols formed by groups of data bits before mapping the symbols to the plurality of sub-carriers assigned to a respective constellation group.

6. The communications device of claim 2, further comprising:
control circuitry configured to program a number of the plurality of sub-carriers used by said each scalable interleaver circuitry portion according to the channel state information.

7. The communications device of claim 6, wherein
the control circuitry is further configured to control an assignment of the plurality of sub-carriers to the plurality of constellation groups according to the channel state information.

8. The communications device of claim 6, wherein the control circuitry is configured to determine frequencies of the plurality of sub-carriers used by said each scalable interleaver circuitry portion according to the channel state information.

9. The communications device of claim 1, further comprising:
degrouping circuitry configured to combine the plurality of sub-carriers carrying symbol information for all of the plurality of constellation groups.

10. The communications device of claim 1, wherein
the plurality of constellation groups are rotated, non-orthogonal constellation groups.

11. The communications device of claim 10, wherein
the modulator circuitry includes a plurality of modulation circuitry portions, and
each modulation circuitry portion includes delay circuitry in a same signal output path.

12. The communications device of claim 1, further comprising:
receiving circuitry configured to de-interleave and demodulate a signal as generated by the transmitting circuitry.

13. A communications system comprising:
the communications device of claim 1; and
another communications device comprising:
receiving circuitry that includes:
demodulator circuitry including a plurality of QAM demodulators using different constellation groups, a first group of a plurality of sub-carriers being assigned to a first constellation group of the different constellation groups and a second group of the plurality of subcarriers being assigned to a second constellation group of the different constellation groups, and each constellation group of the different constellation groups using a different demodulation scheme of a plurality of demodulation schemes, wherein
the plurality of QAM demodulators include scalable de-interleaver circuitry configured to de-interleave the first group of the plurality of subcarriers that are assigned to be demodulated by a first demodulation scheme of the plurality of demodulation schemes, and to de-interleave the second group of the plurality of subcarriers that are assigned to be demodulated by a second demodulation scheme of the plurality of demodulation schemes.

14. The communications device of claim 1, wherein the plurality of sub-carriers are assigned to one of the plurality of constellation groups based on the channel state information.

15. The communications device of claim 14, wherein the channel state information is a signal-to-noise ratio of a channel of each of the plurality of sub-carriers.

16. The communications device of claim 1, wherein each of the plurality of sub-carriers whose signal-to-noise ratio falls within a predetermined range is assigned to a same constellation group.

17. A communications device comprising:
receiving circuitry that includes:
demodulator circuitry including a plurality of QAM demodulators using different constellation groups, a first group of a plurality of sub-carriers being assigned to a first constellation group of the different constellation groups and a second group of the plurality of subcarriers being assigned to a second constellation group of the different constellation groups, and each constellation group of the different constellation groups using a different demodulation scheme of a plurality of demodulation schemes, wherein
the plurality of QAM demodulators include scalable de-interleaver circuitry configured to de-interleave the first group of the plurality of subcarriers that are assigned to be demodulated by a first demodulation scheme of the plurality of demodulation schemes, and to de-interleave the second group of the plurality of subcarriers that are assigned to be demodulated by a second demodulation scheme of the plurality of demodulation schemes.

18. The communications device of claim 17, wherein
each of the plurality of QAM demodulators is configured to de-interleave interleaved sub-carriers that carry symbol information contained in data streams.

19. A method of operating a communications device, the method comprising:
mapping data bits to a plurality of constellation groups according to channel state information;
assigning, by circuitry of the communications device, a first group of a plurality of sub-carriers to a first constellation group of the plurality of constellation groups, and a second group of the plurality of subcarriers to a second constellation group of the plurality of constellation groups according to the channel state information;
modulating, by the circuitry and for each constellation group, symbols derived from the data bits mapped to respective constellation groups onto the plurality of sub-carriers assigned to the respective constellation groups, said each constellation group of the plurality of constellation groups using a different modulation scheme of a plurality of modulation schemes; and
interleaving the first group of the plurality of subcarriers that are assigned to be modulated by a first modulation scheme of the plurality of modulation schemes, and interleaving the second group of the plurality of subcarriers that are assigned to be modulated by a second modulation scheme of the plurality of modulation schemes wherein a range of interleaving is programmed according to the channel state information.

* * * * *